(12) United States Patent
Turgis et al.

(10) Patent No.: US 7,545,691 B2
(45) Date of Patent: Jun. 9, 2009

(54) MEASURING CIRCUIT FOR QUALIFYING A MEMORY LOCATED ON A SEMICONDUCTOR DEVICE

(75) Inventors: David Turgis, Le Touvet (FR); Bertrand Borot, Le Cheylas (FR)

(73) Assignee: STMicroelectronics SA, Montrouge (FR)

( * ) Notice: Subject to any disclaimer, the term of this patent is extended or adjusted under 35 U.S.C. 154(b) by 200 days.

(21) Appl. No.: 11/750,456

(22) Filed: May 18, 2007

(65) Prior Publication Data

US 2007/0297253 A1 Dec. 27, 2007

(51) Int. Cl.
G11C 29/00 (2006.01)
(52) U.S. Cl. ............. 365/201; 365/189.02; 365/230.02; 324/442; 324/236; 324/436; 324/135; 331/57
(58) Field of Classification Search ................. 365/201, 365/189.01, 230.02; 324/442, 236, 436, 324/135; 331/57
See application file for complete search history.

(56) References Cited

U.S. PATENT DOCUMENTS

| | | | |
|---|---|---|---|
| 6,732,305 B2 * | 5/2004 | Jones et al. ................. | 714/718 |
| 7,257,328 B2 * | 8/2007 | Levinson et al. ............ | 398/182 |
| 2002/0008503 A1 | 1/2002 | Bucksch et al. | |
| 2004/0046615 A1 * | 3/2004 | Korson et al. ................. | 331/57 |
| 2004/0049711 A1 | 3/2004 | Korson et al. | |

2006/0126412 A1 6/2006 Maki

FOREIGN PATENT DOCUMENTS

| | | |
|---|---|---|
| EP | 0020999 | 1/1981 |
| JP | 62120698 | 6/1987 |
| JP | 03030200 | 2/1991 |
| JP | 09091995 | 4/1997 |
| WO | WO 2005/008677 | 1/2005 |

OTHER PUBLICATIONS

European Preliminary Search Report for French Application No. FR 06 04475, dated Nov. 8, 2006.

* cited by examiner

*Primary Examiner*—Huan Hoang
*Assistant Examiner*—Anthan T. Tran
(74) *Attorney, Agent, or Firm*—Lisa K. Jorgenson; Stephen Bongini; Fleit Gibbons Gutman Bongini & Bianco P.L.

(57) ABSTRACT

A measuring circuit is provided for a memory integrated within a semiconductor device. The measuring circuit includes initializing means and an oscillating loop. The initializing means loadings two complementary values into at least two locations of the memory. The two locations are addressed by a first address and a second address. The oscillating loop comprises a logic circuit for alternatively generating the first address and the second address from data read from the memory so as to successively read data from the first and second memory locations to produce an oscillating signal that has a frequency that depends on internal parameters of the memory. Also provided is a method for qualifying a memory by initializing the memory by loading two complementary values into two locations, and generating an oscillating signal with a frequency that is dependent on internal parameters of the memory.

18 Claims, 4 Drawing Sheets

MEASURING CIRCUIT FOR QUALIFYING A MEMORY LOCATED ON A SEMICONDUCTOR DEVICE

CROSS-REFERENCE TO RELATED APPLICATIONS

This application is based upon and claims priority from French Patent Application No. 06 04475, filed May 19, 2006, the entire disclosure of which is herein incorporated by reference.

FIELD OF THE INVENTION

The present invention relates to the field of microelectronic circuits, and more particularly to a measuring circuit for qualifying an on-chip memory located on a semiconductor device.

BACKGROUND OF THE INVENTION

Electronic memories are significantly important in more recent electronics circuits. Today, there are very few electronic circuits which do not incorporate one or more electronic memory circuits for the purpose of storing the microcode or the data to process.

The integration of a memory circuit in a more general microelectronic chip requires the qualification of the memory, which includes characterization, to precisely determine the internal parameters of the memory circuits which closely depend on the manufacturing process. Such parameters include the access time, the setup time and the hold time.

Figure 1:
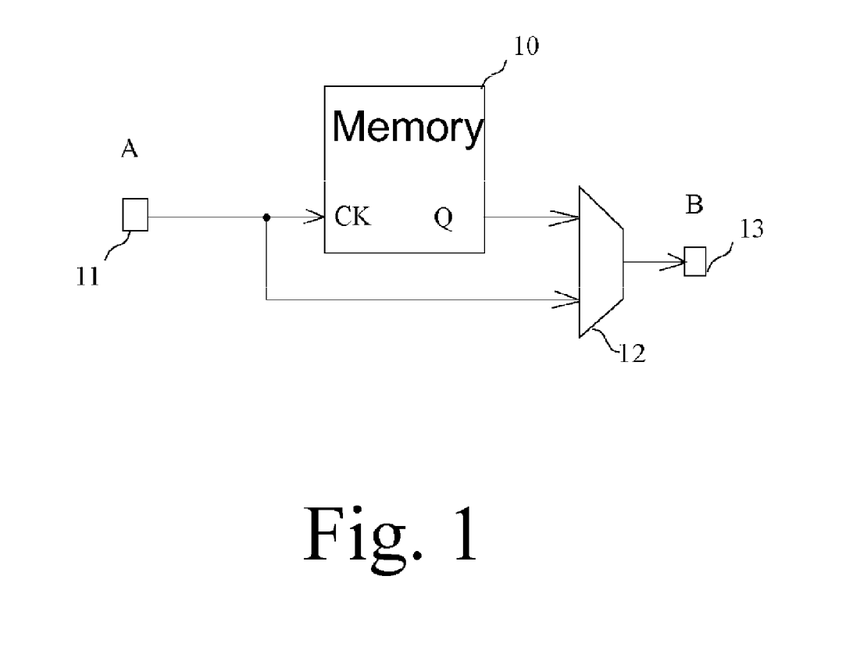
FIG. 1 illustrates a first known method for measuring the internal parameters of a memory circuit.

Methods are known for accessing the internal parameters of a memory circuit. A first method is known as "DUMMY PATH". This method involves measuring the access time of a memory 10 to be qualified using the arrangement of two different transit paths for data between an input terminal 11(A) and an output terminal 13(B), as shown in FIG. 1. A multiplexer 12 allows the selection of one of the two paths for the purpose of measuring the transit time and thus, by computing the difference between the two measurements, the access time of the memory circuit 10 can be evaluated.

This first known method unfortunately has a significant drawback due to the low accuracy when operating at high frequencies. Indeed, it proves to be difficult to evaluate the time of transit of information through a memory circuit when this circuit is located within a semiconductor device that includes many different circuits, logical gates, multiplexers, etc., which all introduce their own internal delay in the processing time and, therefore, limit the accuracy of the measurement being made. Generally speaking, it is particularly tricky to accurately measure the time of transit of the information through the "sole" memory unit located within a whole complex micro-electronic chip.

A second known method is using "Built-In Self Test" (BIST) or "Built-In Self Characterization" (BISC) circuits which allow the measurement of some parameters of a memory circuit.

Figure 2:
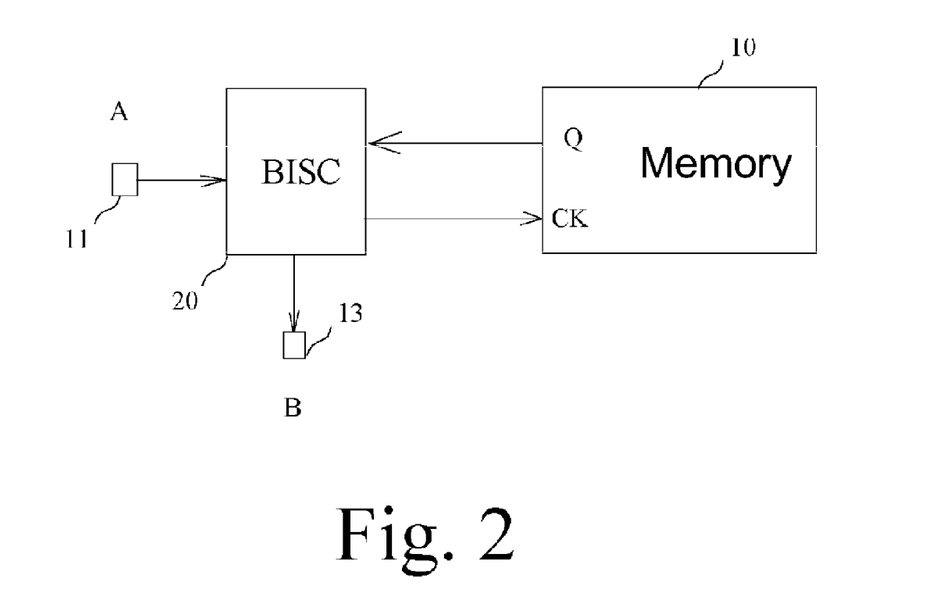
FIG. 2 illustrates a known BISC circuit which provides access to the internal parameters of a memory circuit.

FIG. 2 shows the principle of a BISC-type circuit 20 which is located near a memory circuit 10 which has to be qualified. The BISC circuit generates a clock signal CK that is supplied to the memory 10 and receives back the data Q which is read from that memory. A complex processing is carried out to allow the qualification of some internal parameters of the memory to be achieved, particularly the access time and the setup time.

Known BISC circuits allow an improved accuracy with respect to the "DUMMY PATH" method, but necessitate the use of complex circuits that require significant space on the semiconductor substrate and this limits their use in complex semiconductor devices that are already filled with many internal circuits. At the same time, the need for qualifying a memory is particularly relevant in such complex semiconductor devices.

This is the reason why BISC circuits are generally used only for preproduction memories that are manufactured only for the purpose of the test and qualification process. These BISC circuits allow the internal parameters of the preproduction memories to be widely and extensively tested before starting mass production of customer memories which do not incorporate the BISC circuits. However, this solution is clearly not satisfactory.

SUMMARY OF THE INVENTION

It is an object of the present invention is to overcome these problems and to provide a BISC circuit which is easy to manufacture and which gives access to the internal parameters of a memory, such as the setup time, the access time and the hold time.

A further object of the present invention is to provide a characterization and qualification circuit for a memory which permits the access time, the setup time and the hold time to be measured.

Another object of the present invention is to provide a memory circuit that automatically determines its internal parameters using circuits that are easy to manufacture and to integrate within a semiconductor device.

Yet another object of the present invention is to provide an automatic qualification process for a memory circuit which is to be packaged within a semiconductor device.

One embodiment of the present invention provides a measuring circuit for a memory integrated within a semiconductor device. The measuring circuit includes initializing means, an oscillating loop, and first and second multiplexing circuits. The initializing means loads two complementary values into at least two locations of the memory that are addressed by a first address and a second address. The oscillating loop comprises a logic circuit for alternatively generating the first address and the second address from data read from the memory so as to successively read data from the first and second memory locations to produce an oscillating signal that has a frequency that depends on internal parameters of the memory. The first multiplexing circuit has first and second inputs and an output producing a first output signal. The first input receives a clock signal for starting an oscillating mode, and the first multiplexing circuit is controlled by a first control signal. The second multiplexing circuit has first and second inputs and an output producing a second output signal. The first input receives an output from the memory and the second input receiving the first output signal from the first multiplexing circuit. The second multiplexing circuit is controlled by a second control signal that determines the oscillation mode of the oscillation loop. The memory comprises a clock input that receives the first output signal from the first multiplexing circuit, and an output that produces the data being read.

The present invention further provides a semiconductor product which is fully autonomous, such as a memory for instance, which is fitted with its own qualifying and measurement circuit.

Another embodiment of the present invention provides a method for qualifying a memory. According to the method, the memory is initialized by loading two complementary values into two locations that are addressed by a first address and a second address. An oscillating signal is generated from a first oscillating loop comprising a logic circuit that alternately generates the first and second addresses from data read from the memory, so as to produce the oscillating signal with a frequency that is dependent on internal parameters of the memory. A first multiplexing circuit is used to produce a first output signal, with the first multiplexing circuit receiving a clock signal for starting an oscillating mode and being controlled by a first control signal. A second multiplexing circuit is sued to produce a second output signal, with the second multiplexing circuit receiving an output from the memory and the first output signal from the first multiplexing circuit. The second multiplexing circuit is controlled by a second control signal that determines the oscillation mode of the oscillation loop. The first output signal from the first multiplexing circuit is supplied to a clock input of the memory.

BRIEF DESCRIPTION OF THE DRAWINGS

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF THE PREFERRED EMBODIMENTS

Preferred embodiments of the present invention will be described in detail hereinbelow with reference to the attached drawings.

One embodiment of the present invention provides a measuring circuit for qualifying the parameters of a memory integrated within a semiconductor device that includes addressing circuits, clock circuit, and a read circuit. The measuring circuit includes an initializing circuit and an oscillating loop. The initializing circuit loads into at least two locations of the memory two complementary values, with the two locations being addressed by a first and a second address. The oscillating loop comprises a logic circuit for alternatively generating the first and the second addresses from data read from the memory so as to successively perform read operations of the first and second memory locations so as to produce an oscillation effect which can be measured either internally or externally and which has a frequency that depends on the internal parameters of the memory.

Preferably, the logic circuit comprises a circuit for generating a clock signal having a rising edge from every change of the signal read from the memory, and a circuit for internally measuring the frequency of the signal generated by the successive read operations of the first and the second locations so as to measure the access time of the memory.

In some embodiments, the measuring circuit may not include a circuit inside the device for measuring the signal generated by the successive read operations. This frequency can be measured during the Electrical Wafer Sort phase, so as to allow a reduction of the surface area used on the substrate.

In one embodiment, the logic circuit allows the switching from a first oscillating mode wherein the memory to be qualified is incorporated within the oscillating loop to a second oscillating mode wherein the memory to be qualified is not incorporated within the oscillating loop so as to allow accurate measurements of the access time of the memory.

In one embodiment, the circuit comprises a circuit for allowing adjustment of the delay of presentation of the rising edge of the clock signal to the memory so as to detect the stopping of the oscillation and thus allow the measurement of the setup time of the memory.

In another embodiment, the circuit comprises a circuit for introducing a change in the address being presented to the memory, with an adjustable delay, so as to detect the stopping of the oscillating loop and thus allow the measurement of the setup time of the memory. The difference between the access time and the cycle time can be precisely measured.

One embodiment of the present invention provides a semiconductor device which is fully autonomous, such as a memory, that is fitted with its own qualifying and measurement circuit.

Another embodiment of the present invention provides a process for qualifying a memory. According to the process, the memory is initialized by loading into two locations two complementary values, with the locations being addressed by first and second addresses. A first oscillating loop is generated through a logic circuit that alternately generates the first and second addresses from the data read from the memory so as to produce an oscillating effect with a frequency which is dependent on the internal parameters of the memory.

Exemplary embodiments of the present invention will now be described in detail with reference to FIGS. 3-8.

Preferred embodiments of the present invention provide a circuit which is easy to manufacture and to integrate within an electronic chip and which provides the measurement and qualification of the internal parameters of a memory.

In a first embodiment, there is considered the qualification of a Random Access Memory (RAM) memory circuit of any particular type (SRAM, etc.). One of ordinary skill in the art can easily adapt the teaching of the present invention for the qualification and measurement of the internal parameters of any other type of circuit for storing information, such as a ROM, PROM, EEPROM, etc.

Preferably, the qualification circuit is incorporated within a semiconductor device which also includes a memory circuit, so that there is provided a whole memory product including its autonomous qualifying circuit.

Figure 3:
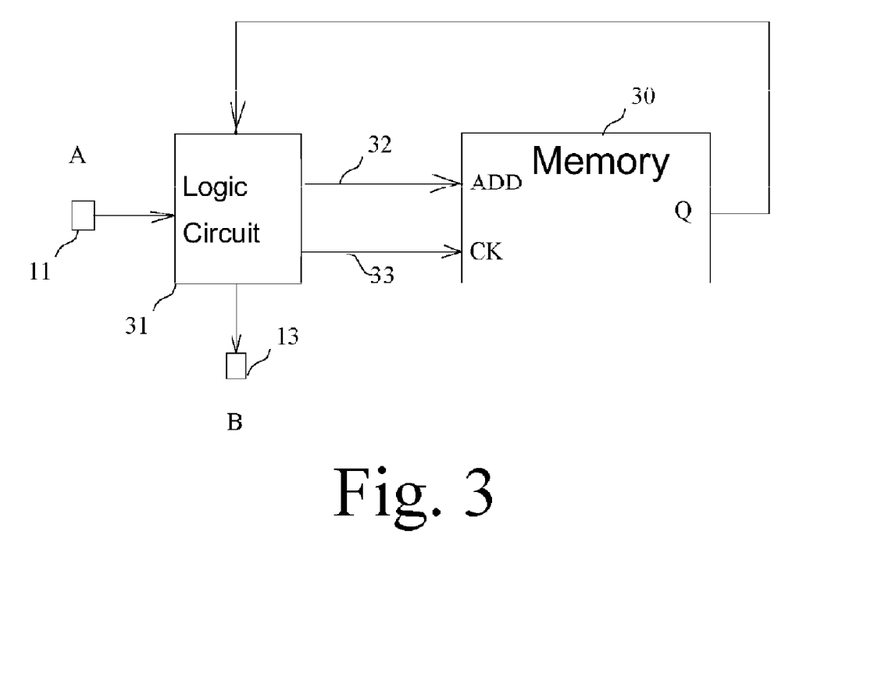
FIG. 3 illustrates a qualification circuit in accordance with one embodiment of the present invention.

FIG. 3 illustrates a qualification and characterization circuit in accordance with one embodiment of the present invention. A setup and initialization circuit (registers, writing initialization phase, etc.) is provided for loading, within the memory circuit to be qualified, two complementary values in two memory locations or cells #1 and #2 defined by respective first and second addresses. For instance, memory circuit 30 includes a first memory location loaded with a value (a logical "0" or "1") and a second memory location loaded with the complementary value (a logical "1" or "0") so as to produce, with a consecutive reading operation of the values stored within the two locations, an oscillating signal.

To achieve this, this embodiment of the present invention includes the memory circuit 30 within an oscillating loop, so that value Q, which his read from the memory 30, is transmitted to a logic circuit 31 that generates an address ADD on line 32 and a clock value CK on line 33 to allow the selection of a second memory cell which is loaded with a complementary value to the value stored in the first cell.

The logic circuit 31 thus allows the switching of the memory circuit at a frequency which is only set by the internal parameters and delays involved within the oscillating loop based on the two memory cells storing complementary values.

The oscillation can be measured, either internally or externally, and has a frequency which is function of the internal parameters of the memory circuit.

Two significant advantages results.

First, the parameters of the memory circuit can be measured thanks to the measurement of the frequency of a signal, which proves to be easier to manage than the measurement of a "delay" as was necessary in the "DUMMY PATH" method. Particularly, the frequency of the signal which is measured does not depend on the particular circuit through which such signal is being transmitted outside the semiconductor device when the measurement needs to be made. The precision of the frequency measurement is thus not affected by the particular number of logic gates, buffering, and intermediate circuits present in the semiconductor device and through which the signal has to be conveyed. Thus, the circuit does not have the drawbacks of the "DUMMY PATH" method, which is very easily affected by the other circuits present within the semiconductor device to be qualified.

Second, the small size of the circuit makes it easy to locate in the vicinity of the memory circuit to be qualified so as to ensure the measurement of a frequency which is closely related to the internal parameters of such memory circuit to be qualified. The small size of the circuit further makes the circuit easy to integrate, without excessive costs, within the semiconductor device.

Generally, the measurement of the signal being generated can be performed in different ways, either through a specific circuit located within the semiconductor device that does not need to remain in the close vicinity of the memory circuit, or by conveying the oscillating signal to an output terminal 13 (B).

Figure 4:
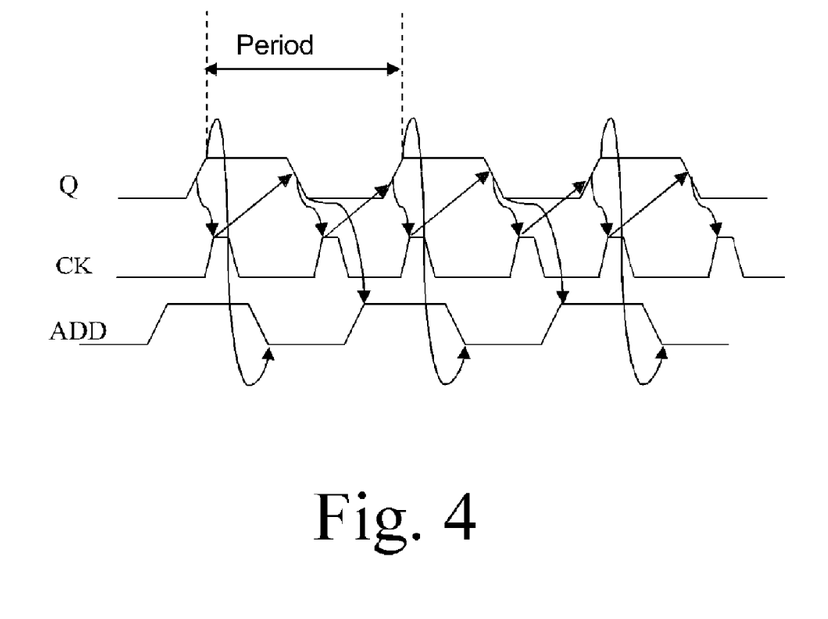
FIG. 4 shows timing diagrams of signals of the circuit illustrated in FIG. 3.

FIG. 4 shows timing diagrams of signals generated by the logic circuit 31. For the sake of clarity, the signals WRITE_ENABLE and CHIP_SELECT have not been represented in the figure, which only shows the ADD, CK, and Q signals.

As shown, when the output Q of the memory circuit 30 switches, this results in a rising edge on the clock signal CK, and also in a corresponding switching of the address signal so as to permit the other memory location containing the complementary value to be addressed. Every rising edge of the clock signal which is thus generated causes, with a delay set by the access time of the memory circuit (which is to be measured), the switching of the output Q of the memory circuit 30.

There is thus provided an oscillating circuit which has a frequency which is directly and closely dependent on the internal parameters of the memory. The memory locations which are involved in the oscillating loop can be chosen according to numerous criteria. Generally, two memory locations having bit lines that are remotely located within the memory matrix can be used in order to measure an evaluation of the maximum access time. one of ordinary skill in the art can easily adapt the teaching of the present invention so as to measurement other specific parameters.

Such an arrangement provides distinctive advantages.

Figure 6:
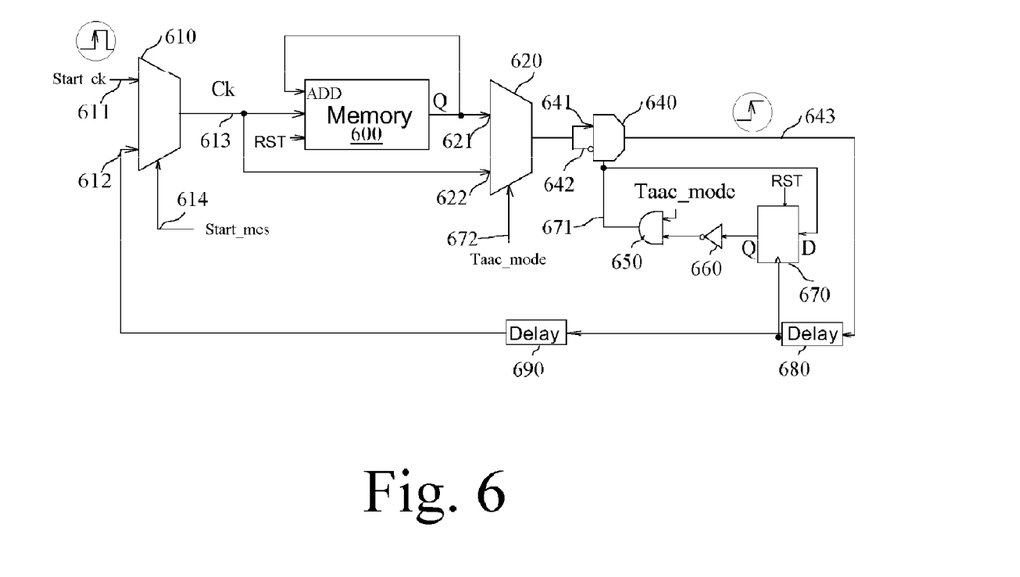
FIG. 6 illustrates a first embodiment of a measuring circuit for measuring the access time of a memory circuit.

FIG. 6 illustrates a first embodiment of the oscillating loop which provides for the measurement of the access time of a memory circuit 600 having an address input ADD and an output Q used for read operations. A reset input RESET is used for initializing the memory so that two specific locations will be loaded with two complementary values.

The circuit shown in FIG. 6 includes a first multiplexer 610 having a first input 611 receiving a signal START_CK that is used for generating the first rising edge of the clock signal CK to start the oscillation of the oscillating loop. The first multiplexer 610 also includes a second input 612 and an output 613 which is connected to the clock input CK of the memory circuit 600 to be measured and qualified. The multiplexer is controlled by a control input 614 that receives a signal START_MES.

The circuit further includes a second multiplexer 620 having a first input 621 connected to the output Q of the memory circuit 600 and a second input 622 connected to the output of the first multiplexer 610, which carries the signal CK.

The second multiplexer 620 has a control input 672 which receives a signal Taac_mode and has an output which is connected to a first input 641 and a second input 642, which is an inverting input, of a third multiplexer 640. The output of the third multiplexer 640 is connected to the input of a first delay circuit 680, which has an output connected to the input of a second delay circuit 690 and also to the clock input CK of latch 670. The second delay circuit 690 has an output which is connected to the second input of the first multiplexer 610.

Latch 670 has an output Q which is connected, via an inverter 660, to a first input of an AND gate 650, which has a second input that receives the signal Taac_mode that is also supplied to the control input of the second multiplexer 620. The output of AND gate 650 generates a signal which is used for controlling the third multiplexer 640 via line 671 and which is also supplied to the input D of latch 670.

The operation of this circuit will now be described.

The process starts with an initialization phase. The oscillating mode is first selected by the Taac_mode signal which is set to a high level. More generally, when the oscillating loop has to incorporate the memory circuit 600, the Taac_mode is set at a value causing the second multiplexer 620 to convey the signal present at the first input 621 to its output. The memory circuit 600 includes two memory locations which are loaded with two values that allow control of the addressing of the memory, such as to permit, in read mode, the alternate reading of the two memory locations that store the two complementary values. In this example, two memory locations #1 and #2, which respectively have the addresses "0" and "1", store the two complementary values "1" and "0" so as to ensure that the read operation of location #1 produces, at the output Q, the value "0" which further causes, at the next rising edge of the clock signal, the addressing of location #2 (having the address "1"), which will produce the value "0" that will serve to address location #1 at the next rising edge of the clock signal. This particular initialization phase, which is illustrated by the RST (reset) control in FIG. 6, permits the alternate reading of the two memory locations loaded with two complementary values so as to cause the generation of an oscillating signal.

From a practical point of view, the oscillation starts with the generation (by an external system not represented in FIG. 6) of a rising edge received at the first input 611 of the first multiplexer 610, which is then conveyed to the output of this multiplexer and then forwarded to the input CK of memory circuit 600.

The input START_MES then switches to a state ensuring that, at the next clock period, the first multiplexer 610 will forward the signal on its second input 612 to its output 613.

Since memory circuit 600 receives at its input CK the first clocking edge, it outputs a value Q (after an access time depending only on the internal parameters of the memory) that is stored in the location defined by the address present at the input ADD of the memory. The initializing phase which was described above results in the switching of the signal present at the first input 621 of second multiplexer 620, so as to generate, as an example, a falling edge.

That signal is then forwarded to the second input of the third multiplexer 640 which causes (every two times thanks to the control signal of line 671 that is generated by the series of elements 670, 660, and 650) an inversion of the edge so as to ensure, at the output 643 of the third multiplexer 640, a rising edge whenever the signal at the output Q of the memory circuit switches. Thus, the third multiplexer 640 alternatively selects input signals 641 and 642 so as to cause every two times an inversion that results in a succession of rising edges for every switching step of the value Q that is read from the memory.

The first delay circuit 680 is used for slightly delaying the clock signal to latch 670 so as to ensure that the third multiplexer 640 is properly switched before controlling the next switching step. This guarantees that, during the oscillating phase, the duration of one cycle is at least greater than the access time of the memory circuit which needs to be qualified and delay circuits 680 and ensures that the duration of the cycle is sufficient in order to achieve a proper oscillation.

The rising edge which is generated on line 643 is further forwarded, via the second delay circuit 690, to the second input of the first multiplexer 610 in order to be conveyed, via line 613, to the input CK of the memory circuit so as to ensure the proper oscillation. The accurate values given to those delay elements are easily determined in accordance with the specific requirements of the circuits, and particularly to ensure that the duration of a cycle is greater than the access time in order to permit proper read operation and to facilitate the measurement of the oscillating frequency. Practically, the delay elements can be embodied in a set of inverters or buffers.

There is thus generated a clock frequency whose value only depends on the access time of the memory circuit 600 and also on the transit time via the multiplexers 610, 620, and 640 and the delay elements 680 and 690.

That clock signal can then be measured by an appropriate circuit, either an internal measuring circuit also located in the semiconductor device, or an external circuit.

The circuit is then switched to a second oscillating mode in which the memory circuit is not incorporated in the oscillating loop, through the Taac_mode signal which is used for controlling the second multiplexer 620 to switch to its second input 622. As shown in FIG. 6, the rising edge of the signal CK at the output of the first multiplexer 610 is then directly forwarded to the output of the second multiplexer 620 without going through the memory circuit to be qualified.

The Taac_mode control signal, which is at a low level, is supplied to one input of AND gate 650 so that the second multiplexer 640 is continuously set to its first input, which results in the direct transmission of the rising edge to the output 643, and then, via delay elements 680 and 690, to the second input of first multiplexer 610.

There is thus produced, in this second oscillating mode, one signal having a frequency which directly depends on the internal delays of elements 610, 620, 640, 680 and 690, which, provided that the two inputs of multiplexer are equally delayed, will be more or less equal to the delays which were measured during the first mode of oscillation.

As with he first mode of oscillation, the value of this frequency can be measured, either by a specific circuit located within the semiconductor device, or by an external device. The value of the frequency of the signal being generated, even when forwarded outside the integrated circuit via multiple electronics stages such as buffers, logic gates, multiplexers, etc., is not affected by the presence of those components and, therefore, the access time of the memory circuit which has to be qualified can accurately be determined.

By computing the difference between the measurements made in the two modes of oscillation, the value of the access time of the memory circuit 600 can be determined. One of ordinary skill in the art can balance the two paths 613 and 621 as well as the internal parameters of the inputs of elements 600 and 620 in order to have the highest accuracy in the measurements.

Advantageously, the measurement of the oscillating frequency is not affected by the present of supplemental circuits located near the memory circuit, which in the "DUMMY PATH" method would spoil the measurement process.

Further, the circuit illustrated in FIG. 6 occupies a limited area on the substrate of the semiconductor device and, therefore, can be easily integrated within the final product purchased by the customer.

Thus, the present invention can provide a whole memory circuit which is fitted with an automatic qualifying circuit and which is easy to incorporate within a semiconductor chip.

Figure 5:
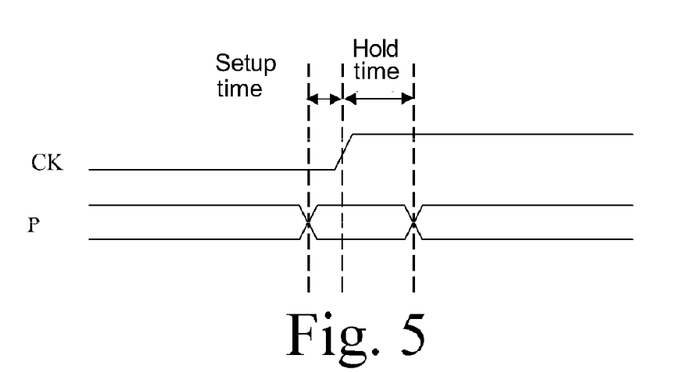
FIG. 5 illustrates a timing diagram representative of the setup and hold times.
Figure 7:
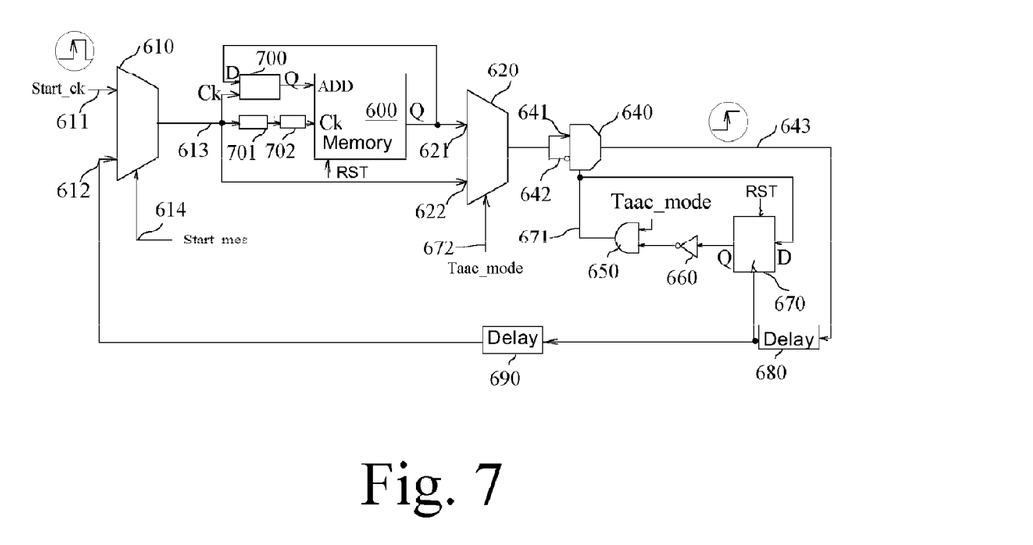
FIG. 7 illustrates a second embodiment of a measuring circuit for measuring the setup time of a memory circuit.

FIG. 7 illustrates a second embodiment of the oscillating loop which provides for measuring the setup time. By definition, as illustrated in FIG. 5, the setup time is the minimum time during which one signal has to remain stable before the occurrence of the rising edge of the clock signal in order to ensure proper operation of the memory circuit. This particular parameter is difficult to measure with known techniques. Particularly, it is not known how to measure this setup time through an external apparatus.

There will now be described, with reference to FIG. 7, a process for simply performing the measurement of the setup time of the addresses. The elements which are common with those in FIG. 6 carry the same references. The qualifying and characterization circuit is modified, with respect to the circuit illustrated in FIG. 6, by the addition of two delay circuits 701 and 702 which are located between the output 613 of the first multiplexer and the input CK of the memory circuit to be qualified. Moreover, an additional D-latch having a D input that receives the value at the output Q of the memory circuit 800 is introduced. The clock input of the D-latch receives the rising edge of the signal at the output of the first multiplexer 610.

Delay element 701 is set to a value which corresponds to the delay of latch 700, whereas the delay element 702 element is an adjustable delay which is used for delaying, in accordance with a control signal, the rising edge of the clock signal forwarded to input CK of the memory circuit to be qualified. Practically, the delay element 702 is embodied, for instance, in a set of multiplexers which can be separately controlled in order to provide an overall adjustable delay. With a significant value of the adjustable delay 702, it can be ensured that the signals present at the address input of memory circuit 600 are clearly stabilized before the occurrence of the clock signal. Conversely, for low values of the adjustable delay, the rising edge of the clock signal can be set to occur in advance (relative to the stabilization of the address signals) and, for a particular value corresponding to the setup time of memory circuit 600, the loop stops oscillating.

Therefore, the setup time of the memory circuit can be easily and accurately measured by testing for which particular values of the adjustable delay 602 the oscillating loop stops oscillating.

The circuit of the present invention can also achieves an accurate measurement of the hold time of memory circuit 600. As known, the hold time is the time during which one signal has to remain stable after the occurrence of a reference signal (clock signal). There is not known any method for providing the accurate measurement of this hold time.

The circuit of the present invention can provide an easy method for measuring the hold time.

Figure 8:
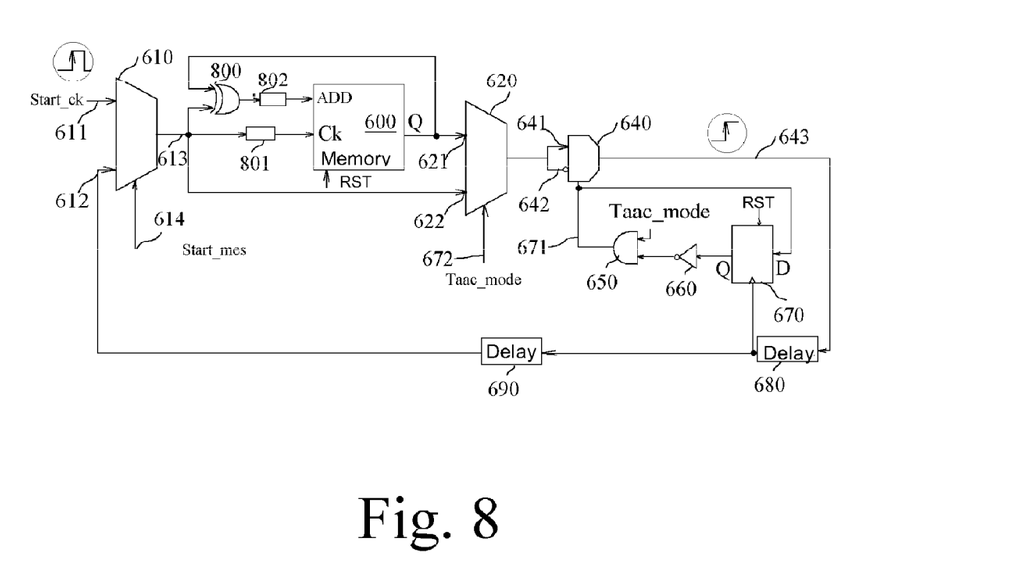
FIG. 8 illustrates a third embodiment of a measuring circuit for measuring the hold time of a memory circuit.

FIG. 8 illustrates a circuit in accordance with a third embodiment of the present invention for measuring the hold time. In addition to the elements already described with respect to FIG. 6 (which carry the same references), FIG. 8 further shows a cascade of two elements, an XOR circuit 800 and an adjustable delay circuit 802 located upstream of the address inputs of the memory circuit.

The XOR circuit 800 includes a first input receiving the value at the output Q of memory circuit and a second input receiving the clock signal generated at the output of the first multiplexer 610. Thus, after the occurrence of the rising edge, the XOR circuit introduces a controlled switching which is then forwarded, via adjustable delay 802, to the input ADD of the memory to be qualified.

The rising edge of the clock is also forwarded to the input CK of the memory via another delay 801, which corresponds to the delay introduced by the XOR circuit 800.

Thus, by adjusting the precise value of the delay introduced by element 802 (e.g., practically defined by a set of multiplexer elements), there can be modified the time during which the address signals remain stable after the rising edge of the clock signal.

For high values of delay 802, the oscillating loop will be able to oscillate as described above.

Conversely, with a reduced value of the delay, the oscillating loop will stop oscillating and this can be used for determining a precise measurement of the hold time of the memory circuit 600.

Therefore, this circuit permits the measurement of this important parameter (i.e., the hold time) through a simple circuit that is easy to realize and to integrate in a semiconductor chip.

Further, the circuit can be embodied on the overall surface of the wafer or substrate so as to permit, later, the measurement of the parameters of those circuits and therefore the overall quality of that wafer.

The measurement of the access time, the setup time, and the hold time has been separately described with reference to FIGS. 6, 7 and 8, respectively. However, any of these three schematics can be advantageously embodied in the same product using multiplexers and logic circuits in order to simplify the presentation and for the purpose of providing the measurement of those three essential parameters of a memory circuit.

The circuit which has been described facilitates the measurement of important parameters, such as the access time, the setup time, and the hold time, and allows a check of whether those parameters fully comply with the values defined in the design for test specification. Moreover, there can be easily measured and checked the precision of the manufacturing process and the design for process monitoring.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A measuring circuit for a memory integrated within a semiconductor device, the measuring circuit comprising:
   initializing means for loading two complementary values into at least two locations of the memory, the two locations being addressed by a first address and a second address;
   an oscillating loop comprising a logic circuit for alternatively generating the first address and the second address from data read from the memory so as to successively read data from the first and second memory locations to produce an oscillating signal that has a frequency that depends on internal parameters of the memory;
   a first multiplexing circuit comprising first and second inputs and an output producing a first output signal, the first input receiving a clock signal for starting an oscillating mode, the first multiplexing circuit being controlled by a first control signal; and
   a second multiplexing circuit comprising first and second inputs and an output producing a second output signal, the first input receiving an output from the memory and the second input receiving the first output signal from the first multiplexing circuit, the second multiplexing circuit being controlled by a second control signal that determines the oscillation mode of the oscillation loop,
   wherein the memory comprises a clock input that receives the first output signal from the first multiplexing circuit, and an output that produces the data being read.

2. The measuring circuit according to claim 1, wherein the logic circuit includes:
   generating means for generating a clock signal that has a rising edge resulting from any switching of the data read from the memory; and
   measuring means for measuring, internally to the device, the frequency of the signal generated by the successive reading of data from the first and second memory locations, so as to measure an access time of the memory.

3. The measuring circuit according to claim 2, further comprising switching means for switching between a first oscillating mode that incorporates the memory within the oscillating loop, and a second oscillating mode that does not incorporate the memory within the oscillating loop, so as to allow an access time of the memory to be accurately measured.

4. The measuring circuit according to claim 2, further comprising a circuit for adjusting a delay of arrival of the rising edge of the clock signal at the memory, so as to allow detection of any stopping of oscillation for measuring a setup time of the memory.

5. The measuring circuit according to claim 2, further comprising a circuit for introducing a change in presentation of the address signals to the memory, with an adjustable delay, so as to allow detection of stopping of the oscillating for measuring a hold time of the memory.

6. The measuring circuit according to claim 1, further comprising switching means for switching between a first oscillating mode that incorporates the memory within the oscillating loop, and a second oscillating mode that does not incorporate the memory within the oscillating loop, so as to allow an access time of the memory to be accurately measured.

7. The measuring circuit according to claim 1, further comprising a circuit for adjusting a delay of arrival of the rising edge of the clock signal at the memory, so as to allow detection of any stopping of oscillation for measuring a setup time of the memory.

8. The measuring circuit according to claim 1, further comprising a circuit for introducing a change in presentation of the address signals to the memory, with an adjustable delay, so as to allow detection of stopping of the oscillating for measuring a hold time of the memory.

9. A semiconductor device comprising:
at least one memory;
initializing means for initializing the memory by loading at least two locations of the memory with complementary values, the locations being addressed by a first address and a second address;
an oscillating loop comprising a logic circuit for successively generating the first address and the second address from data read from the memory so as to successively read from the first and second memory locations to produce an oscillating signal having a frequency that depends on internal parameters of the memory;
a first multiplexing circuit comprising first and second inputs and an output producing a first output signal, the first input receiving a clock signal for starting an oscillating mode, the first multiplexing circuit being controlled by a first control signal;
a second multiplexing circuit comprising first and second inputs and an output producing a second output signal, the first input receiving an output from the memory and the second input receiving the first output signal from the first multiplexing circuit, the second multiplexing circuit being controlled by a second control signal that determines the oscillation mode of the oscillation loop; and
wherein the memory comprises a clock input that receives the first output signal from the first multiplexing circuit, and an output that produces the data being read.

10. The semiconductor device according to claim 9, further comprising a circuit for generating, from the second output signal from the second multiplexing circuit, a rising edge for every change of the second output signal from the second multiplexing circuit, the rising edge being transmitted to the second input of the first multiplexing circuit.

11. The semiconductor device according to claim 10, wherein the circuit for generating the rising edge comprises a third multiplexing circuit having a first input, a second inverting input, and an output, the first input and the second inverting input receiving the second output signal from the second multiplexing circuit, the third multiplexing circuit being controlled so as to produce, every other time, the selection of the second inverting input in order to produce a rising edge for every change of the data being read from the memory.

12. The semiconductor device according to claim 11, further comprising a circuit for adjusting a delay for transmitting the rising edge of the clock signal to the memory, so as to allow detection of stopping of oscillation for measuring a setup time of the memory.

13. The semiconductor device according to claim 11, further comprising a circuit for producing a change in an address presented to the memory, with an adjustable delay, so as to allow detection of stopping of oscillation for measuring a hold time of the memory.

14. The semiconductor device according to claim 9, wherein the memory is a RAM, SRAM, PROM, ROM, or EEPROM.

15. A method for qualifying a memory, the method comprising the steps of:
initializing the memory by loading two complementary values into two locations, the two locations being addressed by a first address and a second address; and
generating an oscillating signal from a first oscillating loop comprising a logic circuit that alternately generates the first and second addresses from data read from the memory, so as to produce the oscillating signal with a frequency that is dependent on internal parameters of the memory,
wherein the generating step comprises:
using a first multiplexing circuit to produce a first output signal, the first multiplexing circuit receiving a clock signal for starting an oscillating mode and being controlled by a first control signal;
using a second multiplexing circuit to produce a second output signal, the second multiplexing circuit receiving an output from the memory and the first output signal from the first multiplexing circuit, the second multiplexing circuit being controlled by a second control signal that determines the oscillation mode of the oscillation loop; and
supplying the first output signal from the first multiplexing circuit to a clock input of the memory.

16. The method according to claim 15, further comprising the step of switching between a first oscillating mode that incorporates the memory within the oscillating loop, and a second oscillating mode that does not incorporate the memory within the oscillating loop, so as to allow an access time of the memory to be accurately measured.

17. The method according to claim 15, further comprising the step of adjusting a delay of arrival of the rising edge of the clock signal at the memory, so as to allow detection of any stopping of oscillation for measuring a setup time of the memory.

18. The method according to claim 15, further comprising the step of introducing a change in presentation of the address signals to the memory, with an adjustable delay, so as to allow detection of stopping of the oscillating for measuring a hold time of the memory.

* * * * *